(12) United States Patent
Kidokoro et al.

(10) Patent No.: US 7,902,482 B2
(45) Date of Patent: Mar. 8, 2011

(54) LASER MACHINING APPARATUS AND CONTROL METHOD FOR THE APPARATUS

(75) Inventors: Hitoshi Kidokoro, Tokyo (JP); Masato Matsubara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1260 days.

(21) Appl. No.: 10/517,656

(22) PCT Filed: Jun. 13, 2003

(86) PCT No.: PCT/JP03/07574
§ 371 (c)(1),
(2), (4) Date: Dec. 13, 2004

(87) PCT Pub. No.: WO03/107496
PCT Pub. Date: Dec. 24, 2003

(65) Prior Publication Data
US 2006/0054602 A1    Mar. 16, 2006

(30) Foreign Application Priority Data

Jun. 14, 2002    (JP) .................................. 2002-173679

(51) Int. Cl.
*H01S 3/13*    (2006.01)
*B23K 26/00*    (2006.01)
(52) U.S. Cl. ............... 219/121.61; 219/121.83; 359/333; 372/33; 398/79
(58) Field of Classification Search ............. 219/121.61, 219/121.62, 121.65–121.72, 121.83, 121.85; 372/33; 359/333; 398/79
See application file for complete search history.

(56) References Cited

U.S. PATENT DOCUMENTS

| 4,128,794 A | * | 12/1978 | Burleson ........................ 318/603 |
| 5,329,215 A | * | 7/1994 | Fraser et al. ................... 318/603 |

FOREIGN PATENT DOCUMENTS

| JP | 57-186378 A | | 11/1982 |
| JP | 57186378 A | | 11/1982 |
| JP | S58-078675 U | | 5/1983 |
| JP | 358141689 A | * | 8/1983 |
| JP | 403011904 A | * | 1/1991 |
| JP | 405022941 A | * | 1/1993 |
| JP | 407111427 A | * | 4/1995 |
| JP | 2000-126879 A | | 5/2000 |
| JP | 02001086232 A | * | 3/2001 |
| JP | 2000-3243749 A | | 8/2003 |
| JP | 2003-243739 A | | 8/2003 |

* cited by examiner

*Primary Examiner* — Samuel M Heinrich
(74) *Attorney, Agent, or Firm* — Sughrue Mion, PLLC

(57) ABSTRACT

A laser beam machine includes a controller for outputting command pulse sets according to control parameter settings for controlling laser pulse output power, a thinning-out circuit, into which the command pulse sets are inputted, for thinning out pulses of the command pulse sets, based on predetermined setting values, an electric power supplying unit for generating, in response to command pulse sets outputted from the thinning-out circuit, pulsed electric power supplied to a load, and a generator for pumping, so as to output a laser beam, a laser medium with which a discharging space is filled, by electric discharge generated by the pulsed electric power supplied from the electric power supplying unit. A pulse width thereof can be considerably varied at low cost with the heat generated by the increase of the switching number of the electric power supplying unit being prevented.

4 Claims, 13 Drawing Sheets

EXAMPLE OF CONTROL PARAMETER SETTING

| | PEAK OUTPUT POWER | REPEATED PULSE FREQUENCY | PULSE WIDTH | PULSE WIDTH MODE (THINNING OUT NUMBER SETTING) |
|---|---|---|---|---|
| CONDITION 1 | p1 | f | t1 | SHORT MODE |
| CONDITION 2 | p1 | f | t2 | LONG MODE |

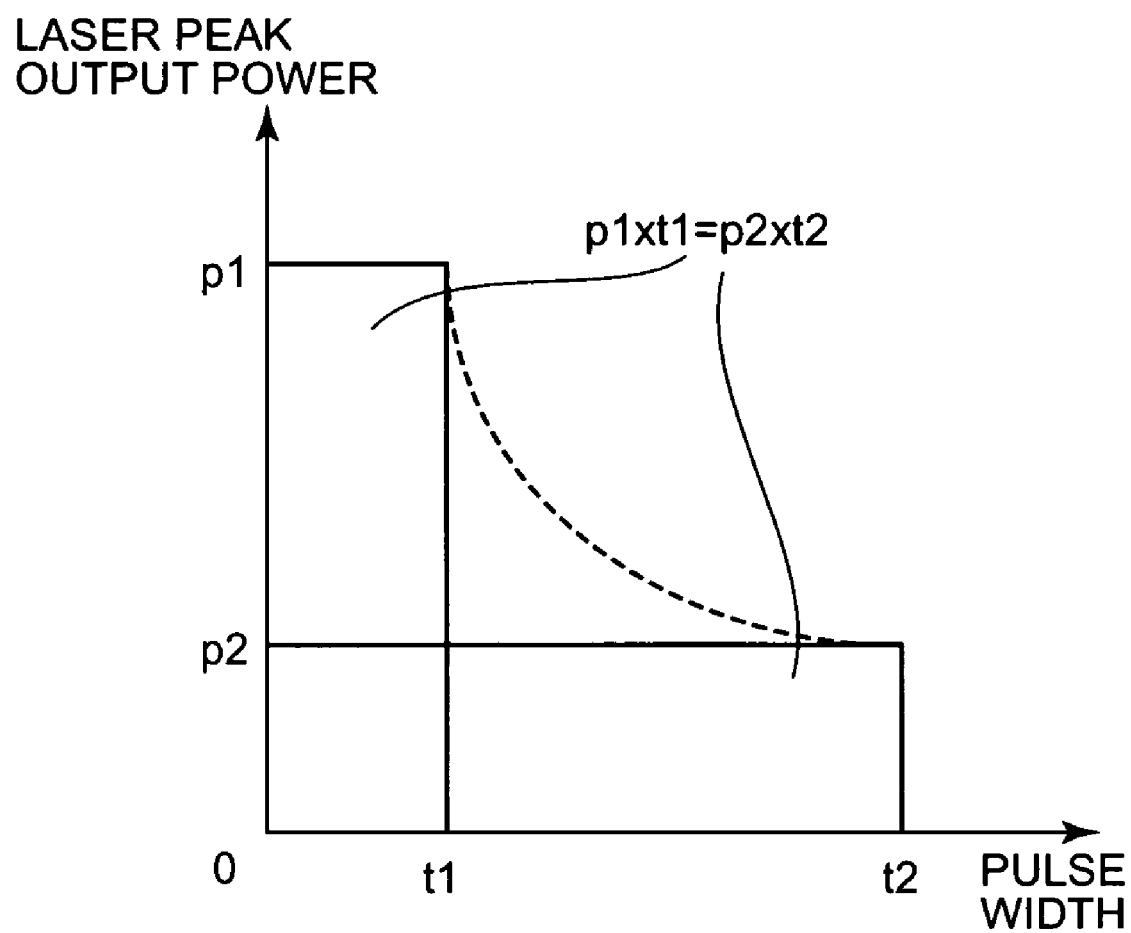

LASER MACHINING APPARATUS AND CONTROL METHOD FOR THE APPARATUS

TECHNICAL FIELD

The present invention relates to laser machining apparatus for pulse laser generation, and control methods for an electric power supplying unit that supplies electric power for generating electric discharge needed for the laser generation; moreover, it specifically relates to the art for expanding machining capability ranges of gas laser machining apparatus by usable ranges of laser-pulse-output pulse-widths being considerably expanded without capacity of the electric power supplying units being increased.

BACKGROUND ART

In recent years, the needs for laser beam machines, which are used for micro machining such as printed-circuit-board machining, for generating pulses whose outputted width is approximately from 1 μs to several dozen μs, have increased, and the machines have been put into practical use.

A basic configuration of a conventional pulse laser generator used in a gas laser beam machine (hereinafter referred to as a pulse laser generator) is illustrated in FIG. 9.

The pulse laser generator is configured in such a way that an electric power supplying unit 3 (composed of, for example, a three-phase rectifier circuit 4, an inverter circuit 5, and a step-up transformer 6) is controlled by command pulse sets 2 outputted from a controller 1, so that electric discharge occurs by electric power being supplied to a discharging space 7 filled with a laser medium (mixed gas), the laser medium pumped by the discharge creates a laser beam 12 in a resonator 8 (composed of electrodes 9, a partially reflecting mirror 10, and a fully reflecting mirror 11), and the laser beam is outputted.

Specifically, when the command pulse sets 2 are outputted from the controller 1, the inverter circuit 5 correspondingly operates and transforms into ac electric power dc electric power rectified in the three-phase rectifier circuit 4, then the ac electric power is stepped-up to a required voltage for the discharge by the step-up transformers.

Here, in the electric power unit used in an industrial gas-laser-beam machine (such as a carbon dioxide gas laser machine), the ac electric power supplied to generate the discharge for pumping the laser medium is, generally, that an applied voltage to the electrodes (hereinafter referred to as a discharging voltage) is several kV, flowing current during discharging (hereinafter referred to as discharging current) is ten and several A (ampere) at its peak, and an ac frequency (hereinafter referred to as a discharging frequency) during discharging is equal to or more than several hundred kHz; consequently, in a case of a pulse laser generator, corresponding to the command pulse sets 2 from the controller 1, the ac power is supplied to the discharging space (the number of the ac components is equal to a switching number N of the inverter circuit 5), and a laser beam is resultantly outputted as illustrated in FIG. 10.

Here, the electric power such as this for discharging is defined to be electric discharging power in this specification.

Then, the machining is performed using each (pulse) of the laser pulses outputted, as described above, being irradiated onto a workpiece to be processed.

Next, the controller 1 for outputting the command pulse sets 2 will be explained in detail.

In the pulse laser beam machines used for micro machining such as printed circuit board machining, principal control parameters have been set for controlling the laser output power of the pulse laser generator, which are, for example, peak output power representing a peak power value of the laser pulses outputted, a repeated pulse frequency representing a frequency for the laser pulses outputted, and a pulse width representing a pulse width of the laser pulses outputted. In addition, the most suitable value of energy per pulse of the laser output (hereinafter referred to as pulse energy) represented by "peak output×pulse width" has been obtained depending on workpiece materials to be machined and machining methods, and each value of the above described control parameters is correspondingly determined.

Here, these control parameters are arbitrarily settable, and the command pulse sets 2 are outputted in response to the parameters that have been set.

The machine system is designed in such a way that the command pulse sets 2 in the controller 1 using these parameters are outputted, so that the laser pulse output power required for the machining is obtained.

In the electric power supplying unit 3, in order to obtain laser pulse energy required for the machining, the electric discharging power peak for controlling the peak output power is controlled using the command pulse sets 2 that are outputted based on the controlling parameters set in the controller 1, and the repeated pulse frequency is controlled; thus, increasing or decreasing of the number of switching times (hereinafter referred to as the switching number) of the inverter circuit 5 is controlled so that the pulse width is controlled.

In addition, because the electric discharging power is principally determined by the discharging voltage applied to the electrodes 9 and the peak of the discharging current that flows caused by the discharging between the electrodes, in order to control the electric discharging power peak, a method is adopted in which the discharging voltage is controlled, or the discharging current peak is controlled, for example, by the inverter circuit 5 being controlled using a PWM (pulse width modulation) controller.

The repeated pulse frequency is equal to the number of the laser pulses irradiated per second, and the number of the command pulse sets, which are outputted from the controller per second.

Here, the repeated pulse frequency is generally much lower than the above described discharging frequency (that is, the switching frequency of the inverter circuit 5); for example, the repeated pulse frequency is at most several kHz while the discharging frequency as described above is higher than several hundred kHz.

The pulse width is determined, corresponding to each of the command pulse sets, by the pulse number of the pulse sets of the electric discharging power that is outputted through the inverter circuit. For example, with respect to the laser pulse output power having a pulse width t as represented in FIG. 10, in a case in which the pulse width needs to be expanded to double (2 t), the laser pulse width becomes double (2 t) by the switching number N of the inverter circuit being set at double (2N) as represented in FIG. 12.

Next, a relationship between the peak output power and the pulse width of the pulse laser outputted from the pulse laser generator is illustrated in FIG. 13.

Here, an area described by "peak output power x pulse width" represents pulse energy.

The upper limit of the pulse energy is determined by the light resistance specification of the fully reflecting mirror and partially reflecting mirror that configure the resonator unit of the laser generator (FIG. 9).

Therefore, for example, in a case in which the pulse energy (=p1×t1) with peak output power of p1 and pulse width of t1 is in the upper limit value of the energy based on the light resistance specification of the mirrors, when the pulse width is required to be expanded from t1 to t2 (t1<t2), if the pulse width is expanded from t1 to t2 with the peak output power p1 being constant, the energy (=p1×t1) exceeds the upper limit of the light resistance of the mirrors, which can cause the mirrors burning out; therefore, the pulse width cannot be simply expanded, and, in such a case, the peak output power needs to be decreased from p1 to p2 (p1×t1≧p2×t2).

In a case in which the peak output power is varied in such a manner as this, although a method in which the discharging voltage applied to the electrodes is varied is generally used, the larger the discharging voltage or the discharging current becomes with respect to the rating of the electric power supplying unit, the larger the load becomes with respect to the electric power supplying unit, meanwhile, the smaller the discharging voltage becomes, the more unstable the discharging becomes (discharge generation becomes difficult); therefore, the variable width of the voltage applied is in general approximately ten percent of the rated voltage.

Now, materials and kinds of machining have been diversified in the micro machining using laser beam machines; that is, because there are cases in which the shorter the laser irradiation time (that is, the narrower the pulse width), the higher the machining quality can be obtained, for example, in a case of machining polyimide resin, and the relatively longer the laser irradiation time (that is, the wider the pulse width), the higher the quality machining can be obtained, for example, in a case of machining glass/epoxy materials containing glass fibers, a pulse laser beam machine in which its pulse width can be considerably varied is demanded.

However, in the conventional control method for the electric power supplying unit used in the gas laser beam machine, because the variable width of the voltage applied is relatively narrow, the pulse width variations must be limited in order to effectively generate the electric discharging without exceeding the upper limit of the light resistance of the mirrors; therefore, it has been difficult to considerably vary the pulse width (for example, varied from 1 μs or shorter than 1 μs to several hundred μs).

Here, it is obviously ineffective from point of its cost vs. performance to use mirrors having higher upper limits of the light resistance.

Moreover, regarding the pulse width control, provided that the switching number of the inverter circuit 5 in the electric power supplying unit 3 is N, the pulse width t of the laser output power is expressed by $$t \propto N$$

as understood also from FIG. 10 and FIG. 12; therefore, in order to increase the pulse width the switching number N needs to be increased.

However, if the switching number of times N increases, the switching loss in a semiconductor device used in the electric power supplying unit increases in proportional to the switching number; consequently, a problem may occur in which the heat generated by the electric power supplying unit increases.

In such a case, by, for example, facilitating more cooling mechanisms in the electric power supplying unit or increasing the number of the devices or circuits installed in parallel, the capacity of the electric power supplying unit itself needs to be increased; as a result, it entails significant size increase of the apparatus itself, bringing disadvantages with respect to not only the cost but also the space for installing the apparatus.

DISCLOSURE OF THE INVENTION

An objective of the present invention, which has been made to solve the foregoing problem, is to provide laser machining apparatus and a control method for the apparatus, in which, in a laser beam machine generating pulse laser beam, its pulse width can be considerably varied at low cost with the heat generation, due to the increase of the switching number, of an electric power supplying unit being prevented.

Laser machining apparatus according to the present invention comprises: a control means for outputting command pulse sets according to control parameter settings for controlling laser pulse output power; a thinning-out means, into which the command pulse sets are inputted, for thinning out pulses from the command pulse sets, based on predetermined setting values; an electric power supplying means for generating, in response to command pulse sets outputted from the thinning-out means, pulsed electric power supplied to a load; and a generating means for pumping, so as to output a laser beam, a laser medium with which a discharging space is filled, by means of discharge generated by the pulsed electric power supplied from the electric power supplying means.

In the apparatus, the switching number of an inverter circuit in the electric power supplying means is changed according to orderly thinning-out of the command pulse sets by the thinning-out means.

In the apparatus, the switching period of the inverter circuit is set shorter than both the time constant for the rise/fall of the electric discharging power and the time constant for the fall of the laser output power.

The apparatus further comprises a switching means for setting thinning-out conditions for the command pulse sets outputted from the control means through the thinning-out means.

Moreover, a control method for laser machining apparatus according to the present invention, includes the steps of outputting command pulse sets according to control parameter settings for controlling laser pulse output power, of generating, in response to the command pulse sets, pulsed electric power supplied to a load, and of pumping a laser medium with which a discharging space is filled, so as to output a laser beam, by means of discharge generated by the pulsed electric power, wherein the method for the apparatus: orderly thins out the command pulse sets so as to change the switching number of an inverter circuit in an electric power supplying means for generating the pulsed electric power.

According to the present invention, the laser pulse width can be considerably expanded with electric discharging voltage being held sufficient to generate discharge.

Moreover, the pulse width can be considerably varied at low cost with the heat, due to the increase of the switching number, generated by the electric power supplying unit being prevented.

Furthermore, by switching the means in response to machining conditions, the machinable range can be expanded wider than that in the conventional one.

BRIEF DESCRIPTION OF DRAWINGS

FIG. 13 is a view illustrating a relationship between pulse width and laser peak output power of a pulse laser generator.

BEST MODE FOR CARRYING OUT THE INVENTION

EMBODIMENT 1

Figure 1:
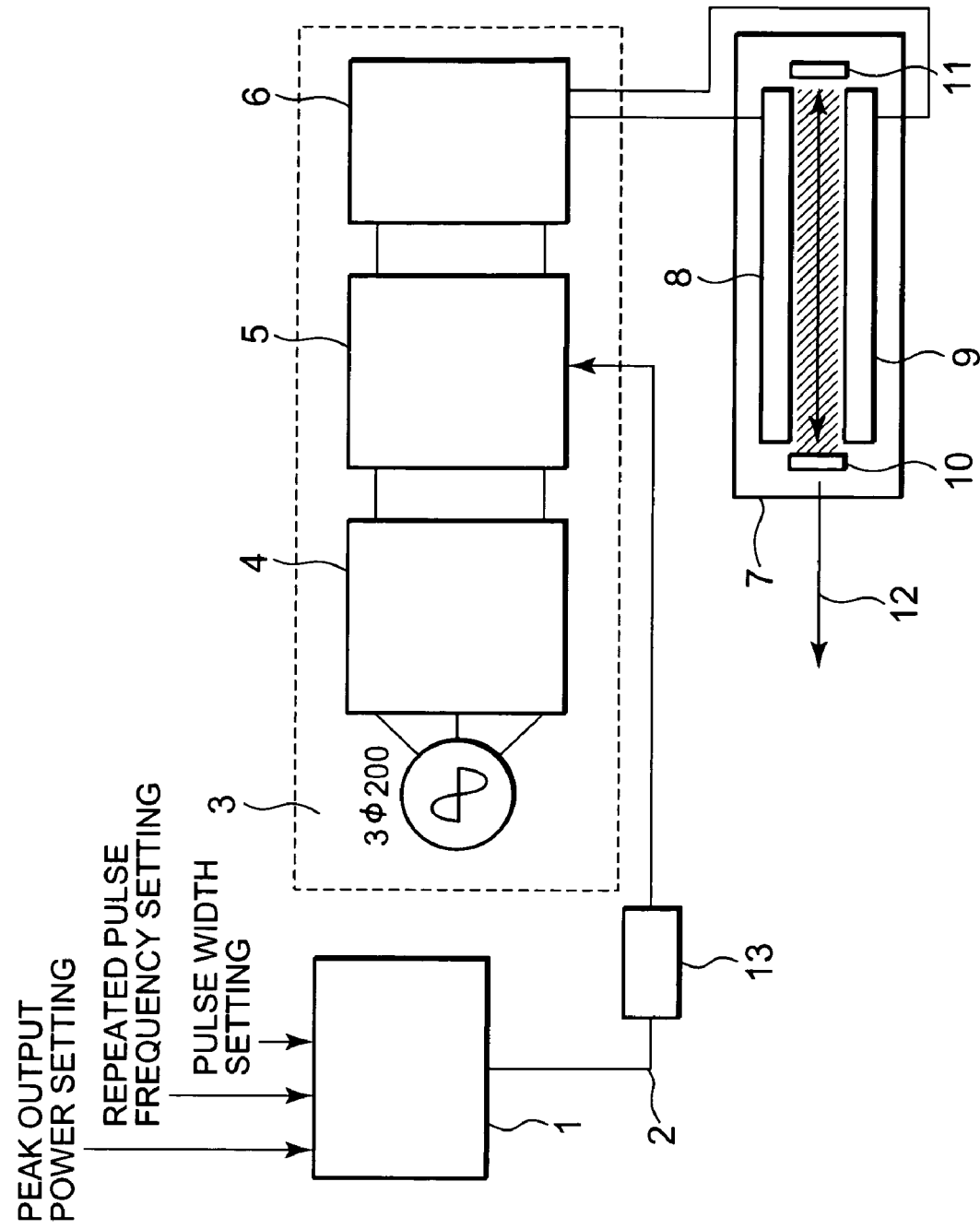
FIG. 1 is a basic configurational view illustrating a pulse laser generator based on an embodiment according to the present invention.

FIG. 1 is a basic configurational view illustrating an embodiment according to the present invention.

In this figure, numeral 1 denotes a controller for controlling laser generation by outputting command pulse sets 2 based on controlling parameters for setting its peak output power, repeated pulse frequency, and pulse width; numeral 3 denotes an electric power supplying unit, which is composed of a three-phase rectifier circuit 4, an inverter circuit 5, a step-up transformer 6, and etc., used in a pulse laser generator; numeral 4 denotes the three-phase rectifier circuit for converting commercial three-phase electric (source) power to dc power by performing full-wave rectification using a thyristor, etc.; numeral 5 denotes the inverter circuit for converting from the dc to a high frequency ac for generating electric discharge needed for obtaining laser output power; numeral 6 denotes the step-up transformer for increasing the voltage that enables discharge; numeral 7 denotes a discharging space filled with a laser medium (mixed gas); numeral 8 denotes a resonator composed of electrodes 9, a partially reflecting mirror 10, and a fully reflecting mirror 11; numeral 12 denotes a laser beam outputted; and numeral 13 denotes a thinning-out circuit that constitutes a thinning-out means for thinning out a predetermined amount of pulses from the outputted command pulse sets 2 according to a pulse width command.

Next, an overview of the whole operation is explained.

The outputted command pulse sets 2 in response to a pulse width command that is set in the controller 1 are inputted into the thinning-out circuit 13, a predetermined amount of the pulses is thinned-out by the thinning-out circuit 13, and the thinned-out pulses are sent to the electric power supplying unit 3.

Next, according to the thinned-out command pulse sets, the inverter circuit 5 operates to convert from the dc power rectified in the three-phase rectifier circuit 4 into ac power; then, by the voltage of the ac power being increased, using the step-up transformer 6, to a voltage needed for electric discharging, the supplied electric power is controlled. As a result, electric discharge occurs by the electric power being supplied to the discharging space 7 filled with the laser medium, the laser medium pumped by the electric discharge creates the laser beam 12 by the resonator 8, the laser beam is outputted, and each of the laser pulses outputted is irradiated onto a workpiece to be processed; consequently, the machining is performed.

Next, the thinning-out circuit is explained in detail.

Figure 2:
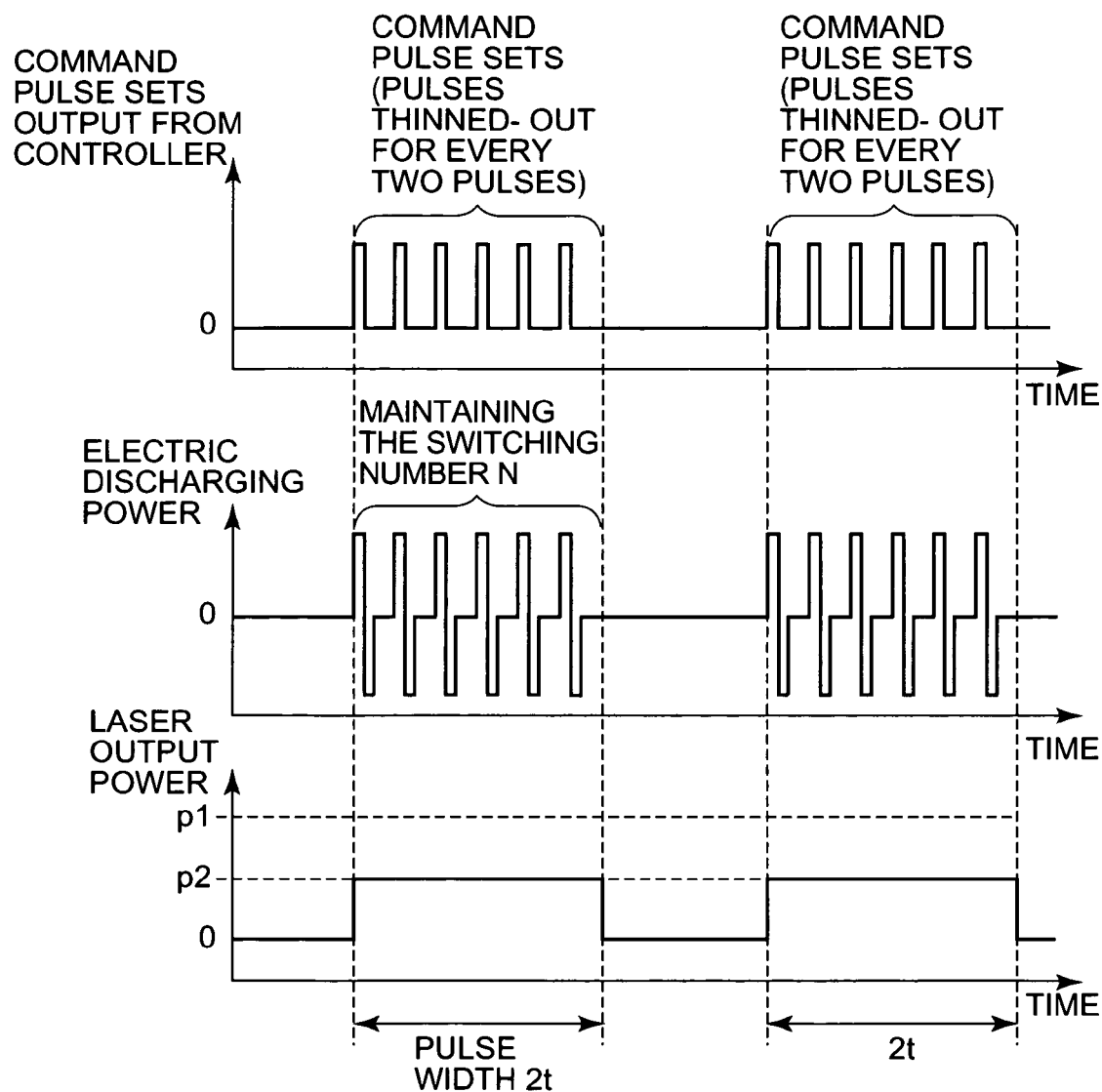
FIG. 2 is a view illustrating command-pulse-set output wave forms from a controller in a case of a pulse width command 2 t, electric-discharging-power wave forms corresponding to the command-pulse-set output wave forms, and laser-pulse-output wave forms corresponding to the electric-discharging-power wave forms, based on the embodiment according to the present invention, that is, a basic configurational view.

In this embodiment, in order to considerably increase the pulse width without increasing the switching number so as to solve the problem in conventional apparatus, ac components of the pulsed electric power are thinned-out by a specified number and at specified intervals, as illustrated in FIG. 2.

Figure 10:
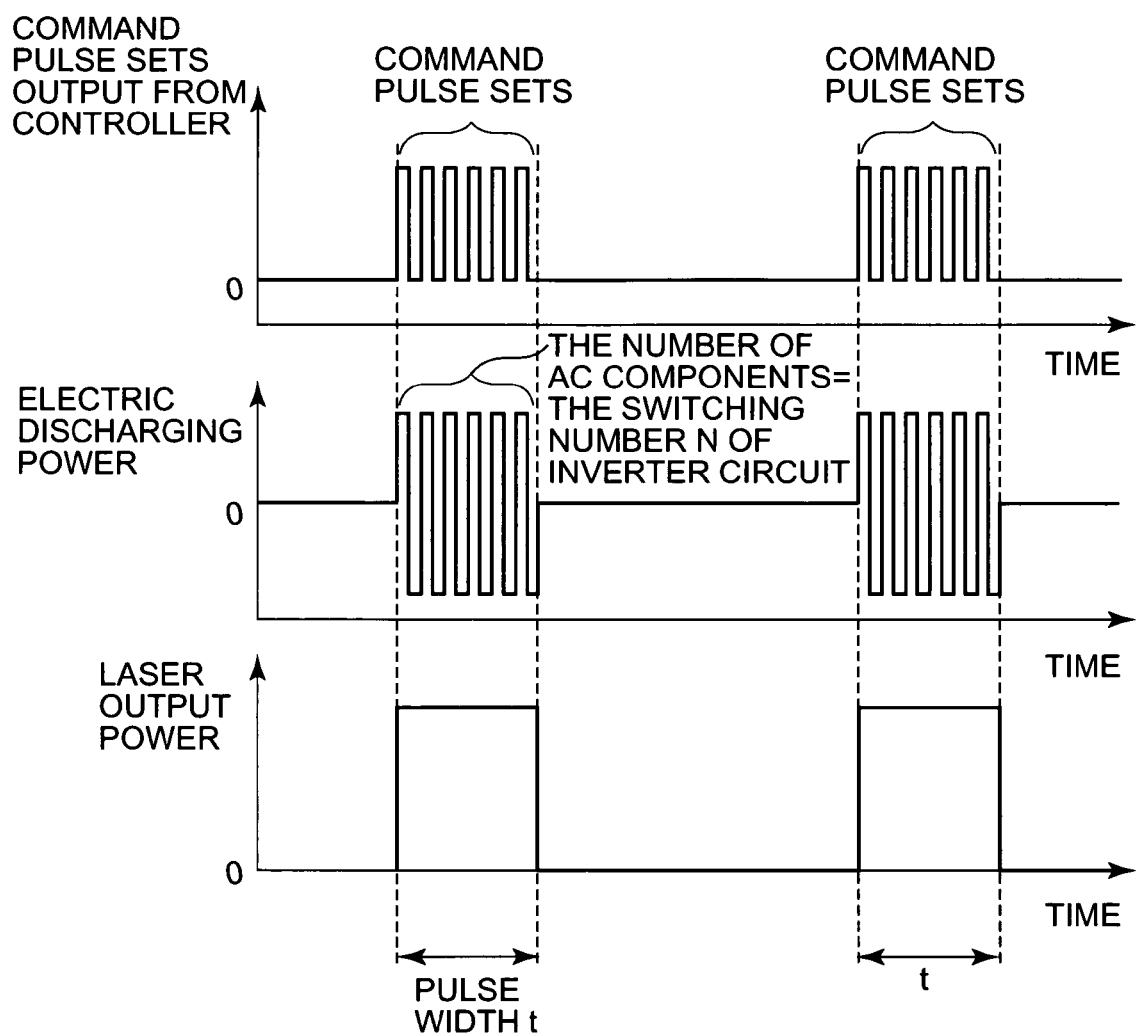
FIG. 10 is a view illustrating command-pulse-set output wave forms from a controller in a case of a pulse width command t, electric-discharging-power wave forms corresponding to the command-pulse-set output wave forms, and laser-pulse-output wave forms corresponding to the electric-discharging-power wave forms, in the conventional generator.
Figure 11:
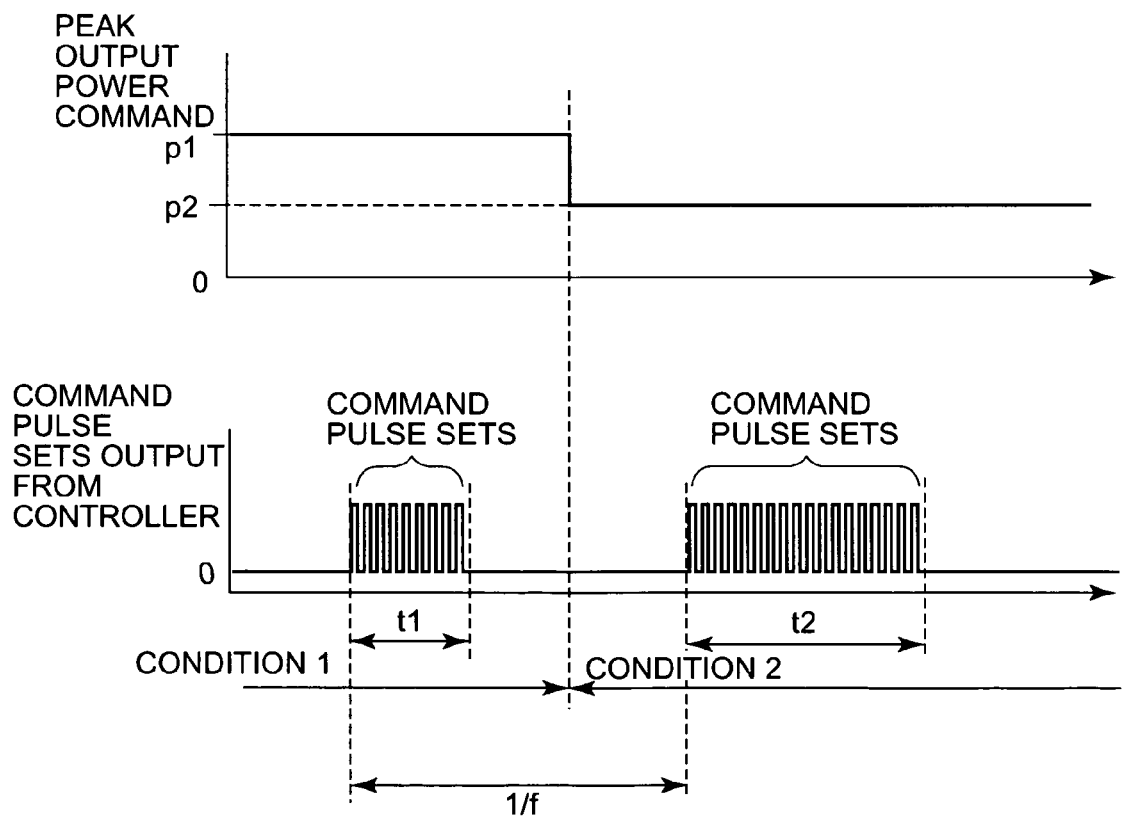
FIG. 11 is a view representing an example of a conventional controller setting screen, and representing its resultant peak output command outputted and command-pulse-set wave forms.
Figure 12:
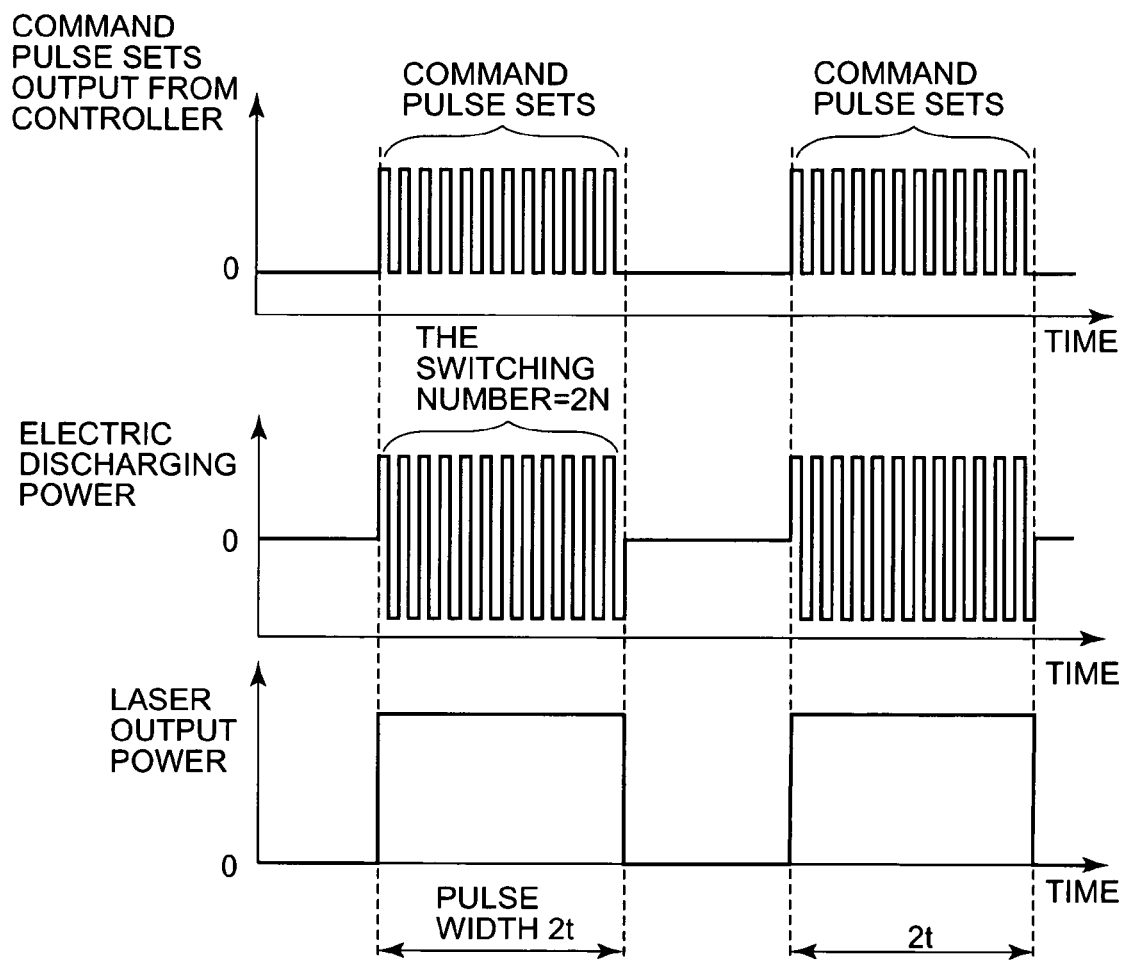
FIG. 12 is a view illustrating command-pulse-set output wave forms from the controller in a case of a pulse width command 2 t, electric-discharging-power wave forms corresponding to the command-pulse-set output wave forms, and laser-pulse-output wave forms corresponding to the electric-discharging-power wave forms, in the conventional generator.

For example, when a pulse has the switching number N and the pulse width t, considering a case in which the pulse width is increased to double, because the pulse width is doubled, generally the switching number N also becomes double (refer to FIG. 10 and FIG. 12).

However, by thinning-out, for example, one pulse for every two pulses of the command pulse sets 2 outputted with the switching number 2N from the controller 1 as illustrated in FIG. 12, the laser pulse width can be made double while maintaining the switching number of the inverter circuit 5 being N.

Figure 3:
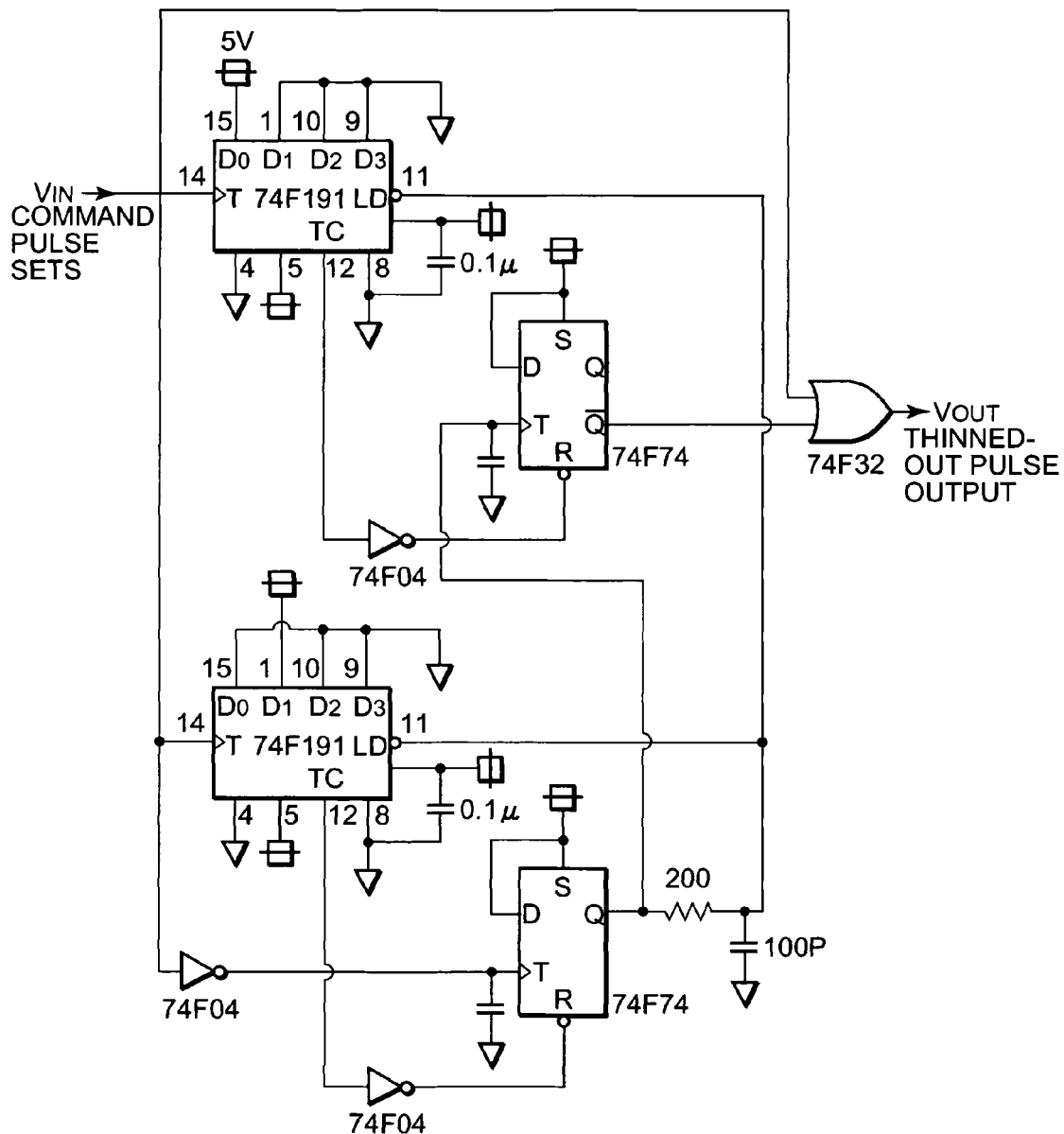
FIG. 3 is a view illustrating an example of a circuit configuration of a thinning-out circuit for constituting a thinning-out means based on the embodiment according to the present invention.

The thinning-out circuit 13 is composed of a general-use logic circuit Including a flip-flop circuit and a counter circuit as illustrated in FIG. 3.

By the command pulse sets 2 outputted from the controller 1 being inputted into $V_{IN}$ of the thinning-out circuit 13, the thinned-out pulse signals are outputted from $V_{OUT}$.

By the thinned-out pulses outputted from the thinning-out circuit 13, corresponding to the command pulse sets 2, being inputted into the inverter circuit 5, ac components of the pulsed electric power, which is generated in the inverter circuit 5, supplied from the electric power supplying unit are also outputted in a thinned-out state.

Here, although a circuit in which pulses are thinned-out for every two pulses is represented in the example, because the discharging current peak and peak output power varies according to thinning-out intervals of the pulses as described later, considering, for example, pulse energy that the resonator mirror included in the laser beam generator permits, it is determined as to for every how many pulses a pulse is thinned-out.

Figure 4:
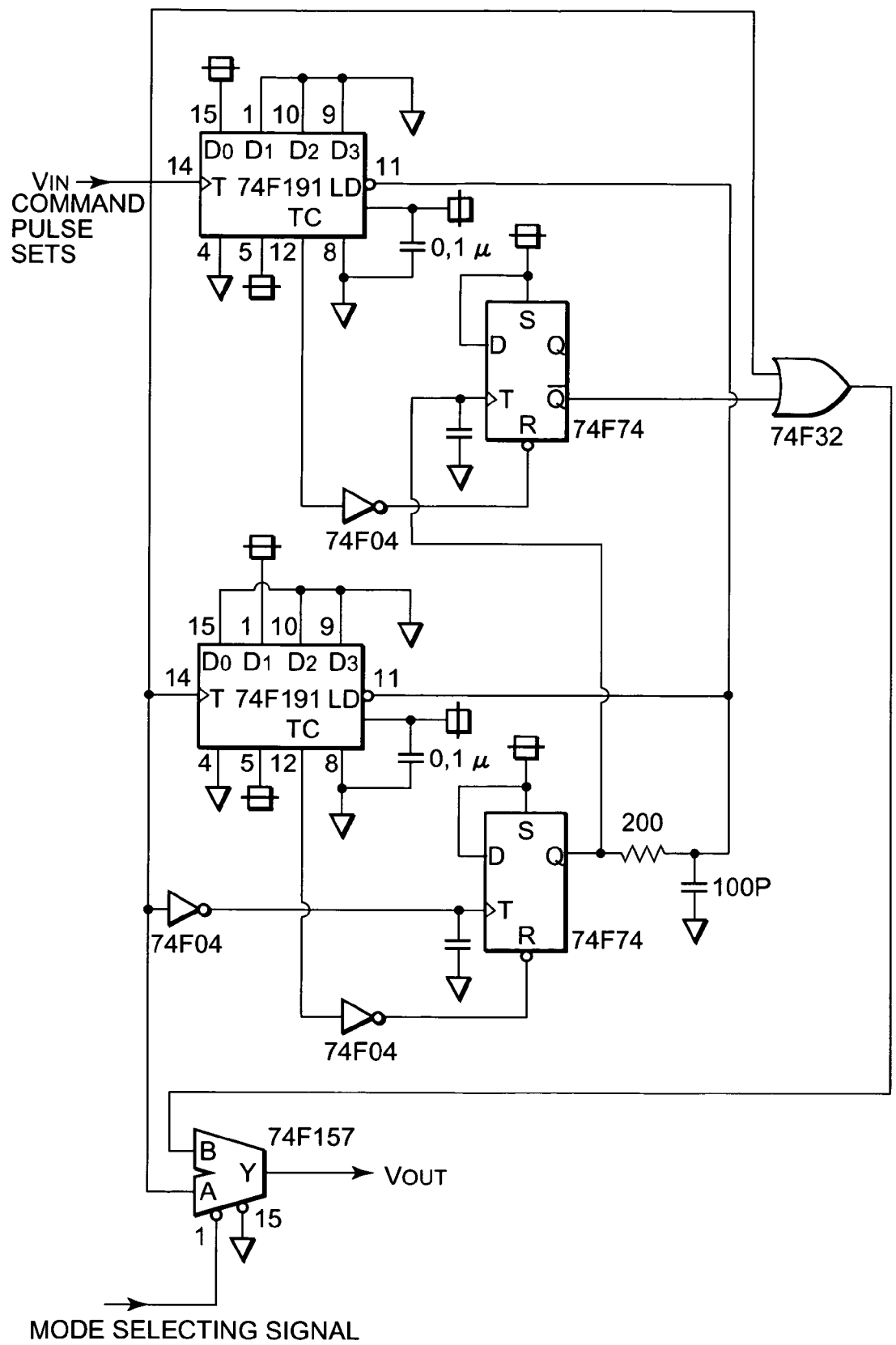
FIG. 4 is a view illustrating an example of a circuit configuration of the thinning-out circuit for constituting the thinning-out means, in which a function for switching the number of thinning-out pulses is provided, based on the embodiment according to the present invention.

Next, a circuit example is illustrated in FIG. 4, in a case in which a function is provided for switching the thinning-out number according to using pulse width In FIG. 4, the circuit is constituted in such a way that two modes are provided (for example, set as a short mode when the thinning-out operation is not performed, while a long mode when one pulse for every two pulses is thinned-out), the controller 1 automatically discriminates which of the modes is selected according to the pulse width setting, and outputs a mode select signal so as to output pulse signals from $V_{OUT}$ with the thinning-out number being switched.

Here, the mode select signal is a logical signal (H or L) outputted from the controller 1 to a multiplexer 14 in the thinning-out circuit 13 depending on the value of the pulse width set in the controller 1; for example, when the pulse width setting in the controller 1 is 1-20 μs, the short mode (the thinning-out operation is not performed) is selected, and regarding the mode select signal, the logical L is outputted from the controller 1 to the thinning-out circuit 13. As a result, inputting signals (=the command pulse sets 2) are selected by the multiplexer 14, and outputted from the thinning-out circuit 13 to the inverter circuit 5.

In contrast, when the pulse width setting is 20-40 μs, the long mode (one pulse for every two pulses is thinned-out) is selected, and regarding the mode select signal, the logical H is outputted from the controller 1 to the thinning-out circuit 13. As a result, resultant command pulse sets that have been thinned-out are selected by the multiplexer 14, and outputted from the thinning-out circuit 13 to the inverter circuit 5.

In this way, by supplying to the generator portion the pulsed electric power in a thinned-out state, the pulse width of the laser pulse output can be considerably expanded without increasing the switching number N.

Therefore, the capacity increase of the electric power supplying unit 3 is not necessary, the heat increase generated in the electric power supplying unit can be also prevented from a point of switching losses in semiconductor devices used in the electric power supplying unit, and therefore the configuration of the apparatus itself becomes compact; consequently, this appears advantageous with respect to not only the cost but also the space for setting the apparatus.

However, when the pulse width control is performed by thinning out the pulses as described above, the switching period of the electric power supplying unit 3 must be set shorter than both the time constant for the rise/fall of the electric discharging and for the fall of the laser output power.

Here, the time constant for the rise of the electric discharging represents the rise time needed for the discharging power to reach a required peak value, while the time constant for the fall of the electric discharging represents the fall time needed for the discharging power to fall from the peak value to the power nil.

Moreover, the time constant for the fall of the laser output power represents the fall time needed for the laser output power to fall from the peak value to the power nil.

The reason why the switching period of the electric power supplying unit must be set shorter than the time constant for the rise/fall of the electric discharging is as follows.

Figure 5:
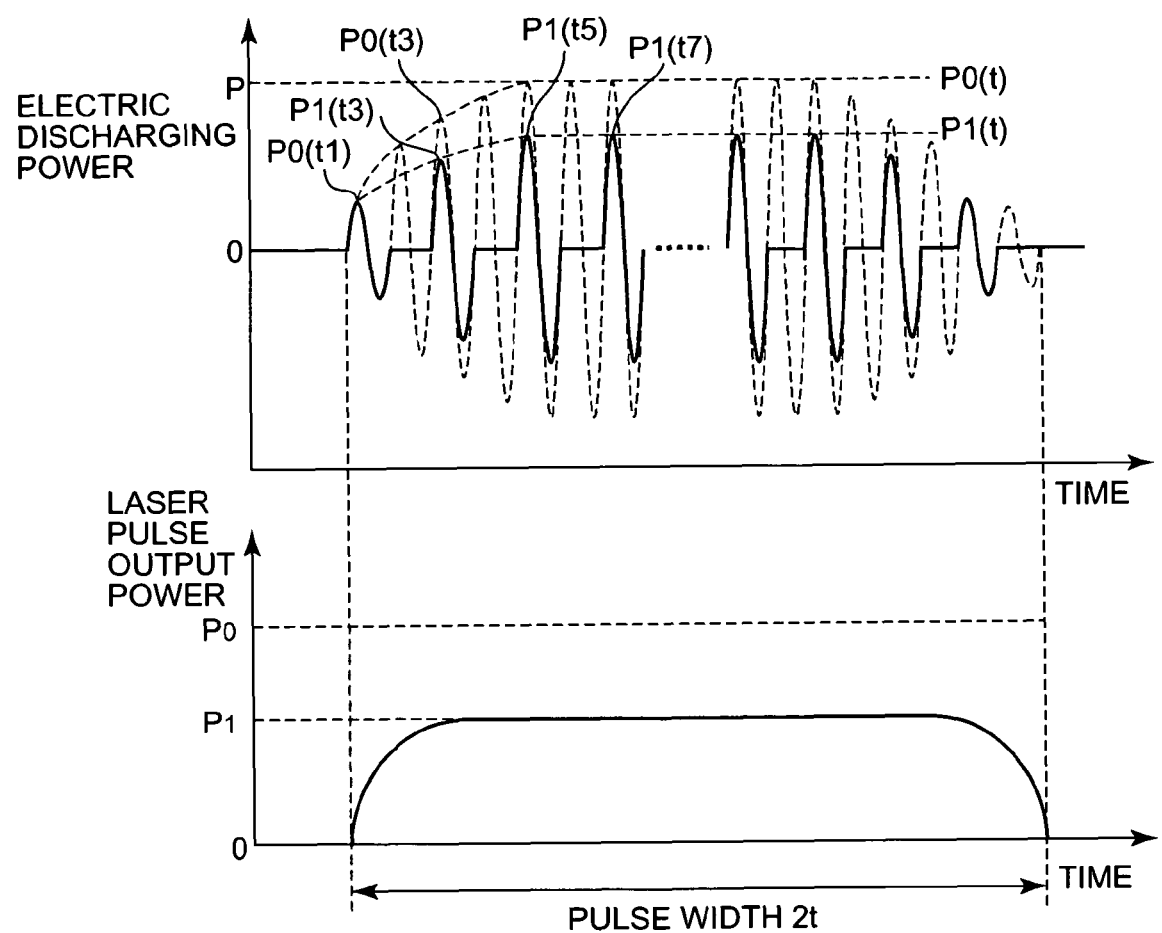
FIG. 5 is a view illustrating electric-discharging-power wave forms and a laser-pulse-output wave form based on a relationship between a switching period of an electric power supplying unit and the time constant for the rise of the electric discharging power.

For example, as illustrated in FIG. 5, provided that four time switching operations are needed until the electric discharging power completely rises in accordance with the electric power supplying unit switching, the electric discharging power that is raised by the first switching operation $P_0(t=t_1)$ is smaller than the peak power P of the electric discharge $P_0(t=t1)<P$), and by thinning out the second switching, the electric discharging power that is raised by the third switching operation is smaller than the electric discharging peak power $P_0(t=t3)$, which is a proper value in a case when the thinning-out operation is not performed, and becomes $P_1(t=t3)$ ($P_1(t=t3)<P_0(t=t3)$).

This relationship is applicable to not only the discharging current peak at the third switching (t=t3) but entire duration of the discharging ($P_1(t)<P_0(t)$, except for the case of t=t1).

Figure 6A:
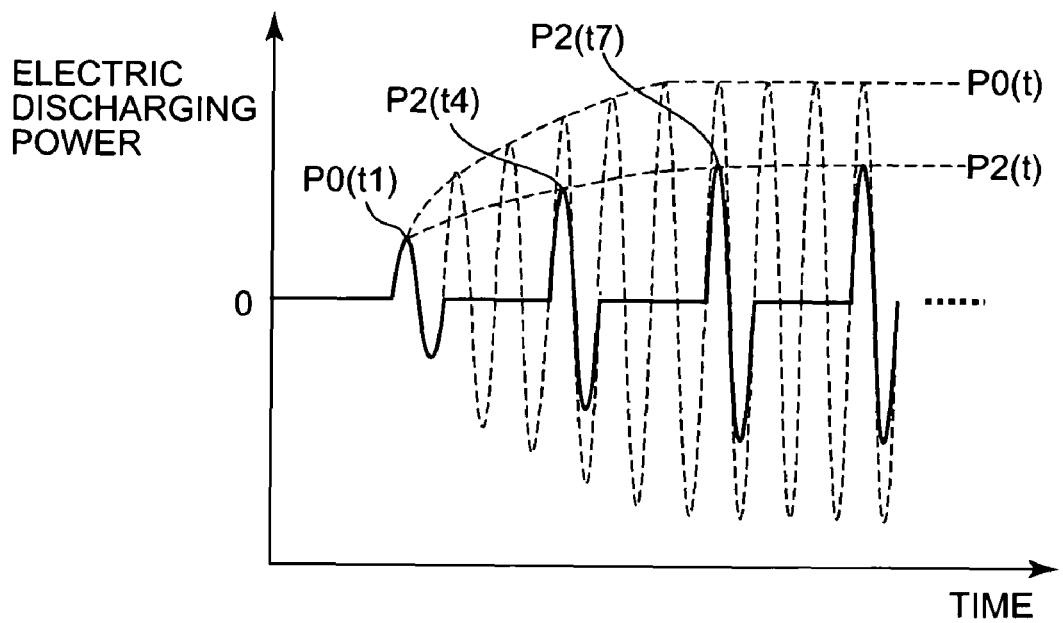
FIGS. 6a and 6b are views illustrating electric-discharging-power wave forms based on the relationship between a switching period of an electric power supplying unit and the time constant for the rise of the electric discharging power.

Similarly, considering a case (refer to FIG. 6(a)) of thinning out two-thirds of all the pulses, that is, after the first switching, for example, a case of thinning out the second and third pulses, holding the fourth pulse, and thinning out the fifth and sixth pulse, the raised electric discharging peak power $P_2(t=t7)$ by means of the seventh switching operation becomes smaller than the electric discharging peak power $P_1(t=t7)$ in a case in which one pulse for every two pulses is thinned-out ($P_2(t=t7)<P_1(t=t7)$), equation $P_2(t)<P_1(t)$ (except for the case of t=t1) is applicable to all the duration of the discharging.

Hereinafter, a similar idea is adopted when thinning out three or more than three consecutive pulses.

However, the minimum value of the electric discharging peak power is electric discharging power peak $P_0(t=t1)$ obtained by the first switching operation, and the thinning-out pulse number n, when $P_n(t)=P_0(t=t1)$ is met, is the limiting value of the thinning-out pulse number.

Figure 6B:
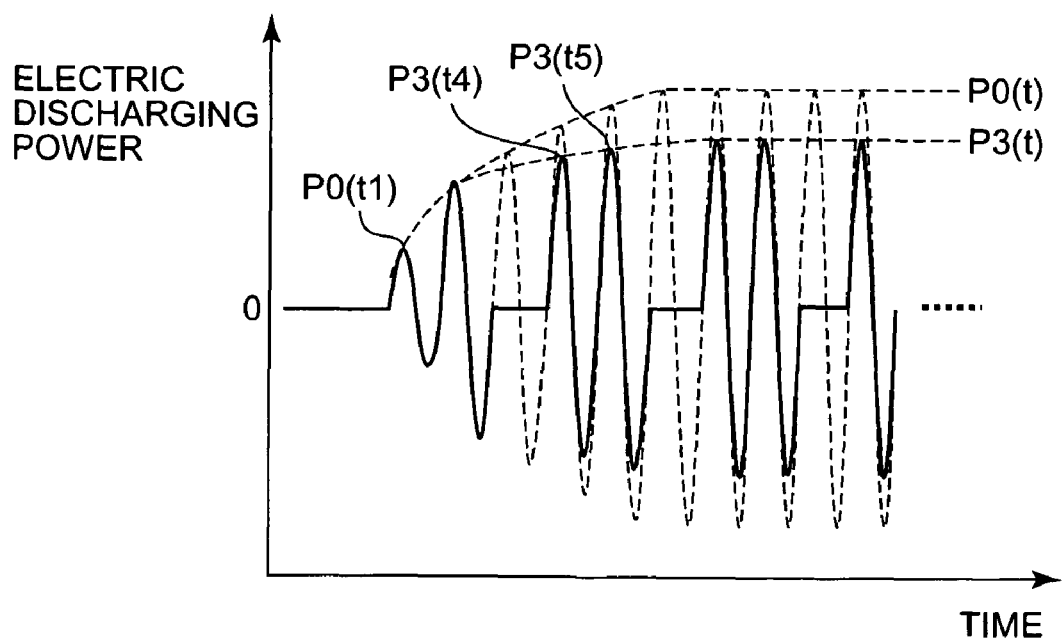

Moreover, when thinning out one pulse every time switching has been completed twice (refer to FIG. 6(b)), a similar idea as described above is also adopted.

After normal switching twice, the raised electric discharging peak power $P_3(t=t4)$ and $P_3(t=t5)$ by means of the fourth and fifth switching operation, by thinning out the third switching operation, becomes smaller than the electric discharging peak power $P_0(t=t4)$ and $P_0(t=t5)$, respectively, which is the value in a case when the thinning-out operation is not performed, but the power becomes larger, owing to the fact that continuous switching operation has been performed twice, than the electric discharging peak power $P_1(t=t5)$, which is the value in a case when one pulse for every two pulses is thinned-out.

Similarly, when the pulses are thinned-out after three times or more than three times of switching operations, a similar idea is also adopted.

That is, generally, the more the pulse intervals (=the number of thinning-out pulses), the smaller the electric discharging peak power becomes; in contrast, the more the number of the consecutive pulses, the larger the electric discharging peak power becomes. However, in any case of thinning-out methods, the electric discharging peak power becomes smaller than the electric discharging peak power $P_0(t)$, which is the value when the thinning-out operation is not performed; consequently, an effect can be obtained, in which the electric discharging peak power is prevented.

This fact means that the peak power of the laser pulse output energy has been brought under control by thinning out the ac components of the electric discharging power, because the laser pulse output power is approximately proportional to the electric discharging power. Therefore, this method is extremely effective for the above described problem, in which the laser pulse output energy increases by expanding the laser pulse width so that it exceeds the upper limit of the light resistance of the resonator mirrors.

Figure 7:
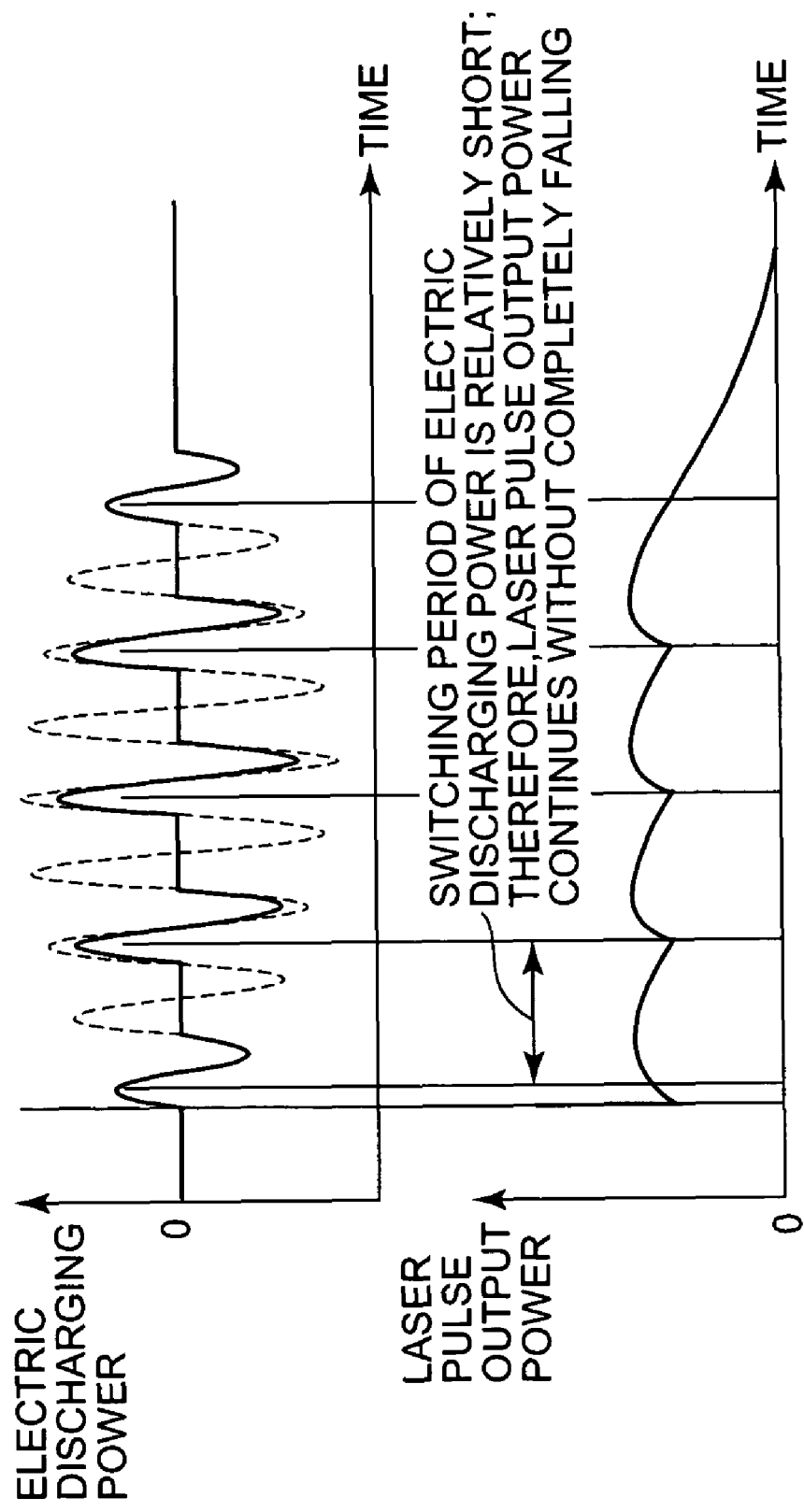
FIG. 7 is a view illustrating electric-discharging-power wave forms and a laser-pulse-output wave form based on the relationship between a switching period of the electric power supplying unit and the time constant for the rise of the electric discharging power.

Moreover, by the switching period of the electric power supplying unit being set shorter than the time constant for the fall of the laser pulse output power, as illustrated in FIG. 7, the next switching operation is performed before the laser pulse output power has completely fallen; therefore, the laser pulse output power is outputted as a single consecutive pulse without completely falling along the way of the operation.

Thereby, an effect of expanding the pulse width of the laser pulse output power is obtained.

For example, if the time constant for the rise/fall of the electric discharging power is approximately 2 µs and the time constant for the fall of the laser output power is approximately 5 µs, the switching frequency may be set equal to or higher than 2 MHz (the switching period is equal to or shorter than 0.5 µs).

Here, in the method of thinning out the command pulse sets in response to the pulse width command when the setting value of the pulse width is relatively large, although a circuit in which the pulses are thinned-out by hardware using the thinning-out circuit 13 is represented, the predetermined number, with respect to the pulses to be inputted, of thinning-out processing in the controller may be performed (that is, processed by software), and command pulse sets obtained from the result of the thinning-out processing may be outputted; thus, the invention is not particularly limited to the methods represented in the embodiment.

Moreover, because the number and ratio of the pulses to be thinned-out are determined according to the required pulse width and laser pulse output energy, or the limitation of the switching number of the electric power supplying unit (that is, the limited amount of heat generated in the electric power supplying unit), they are un-uniform; therefore, the invention is not limited to the specific embodiment thereof.

Figure 8:
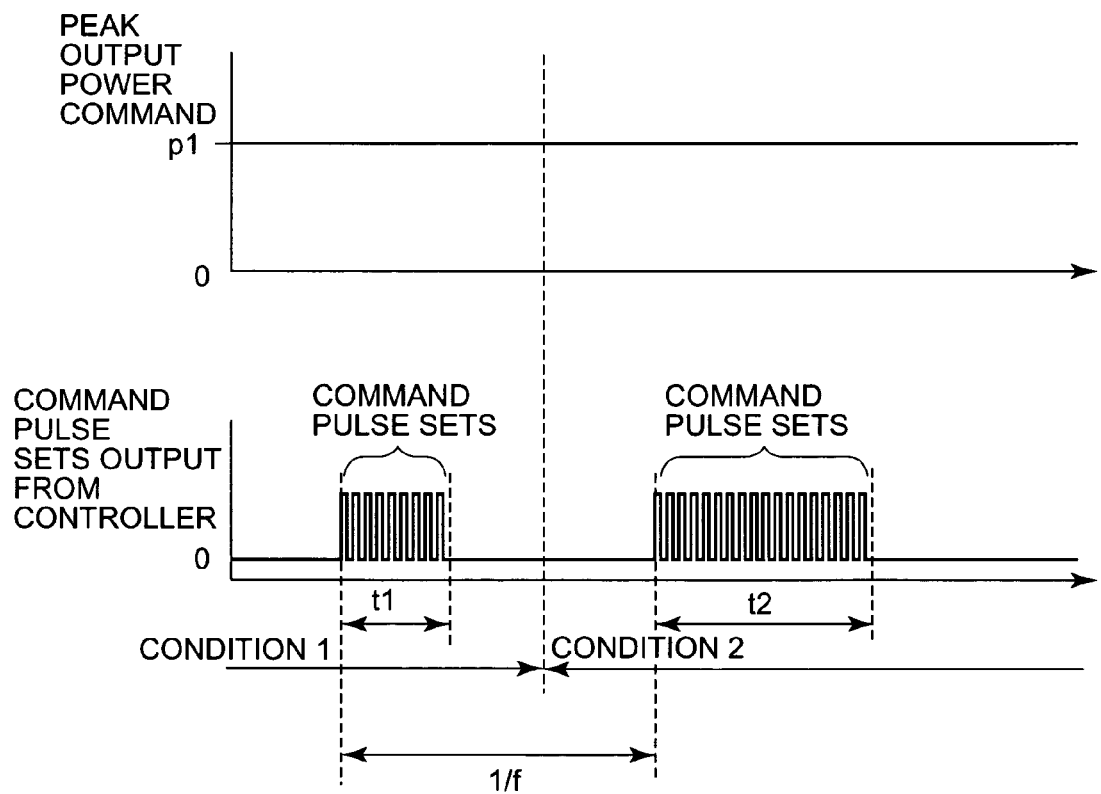
FIG. 8 is a view representing a controller setting screen based on an embodiment according to the present invention, and its resultant command pulse sets outputted.
Figure 9:
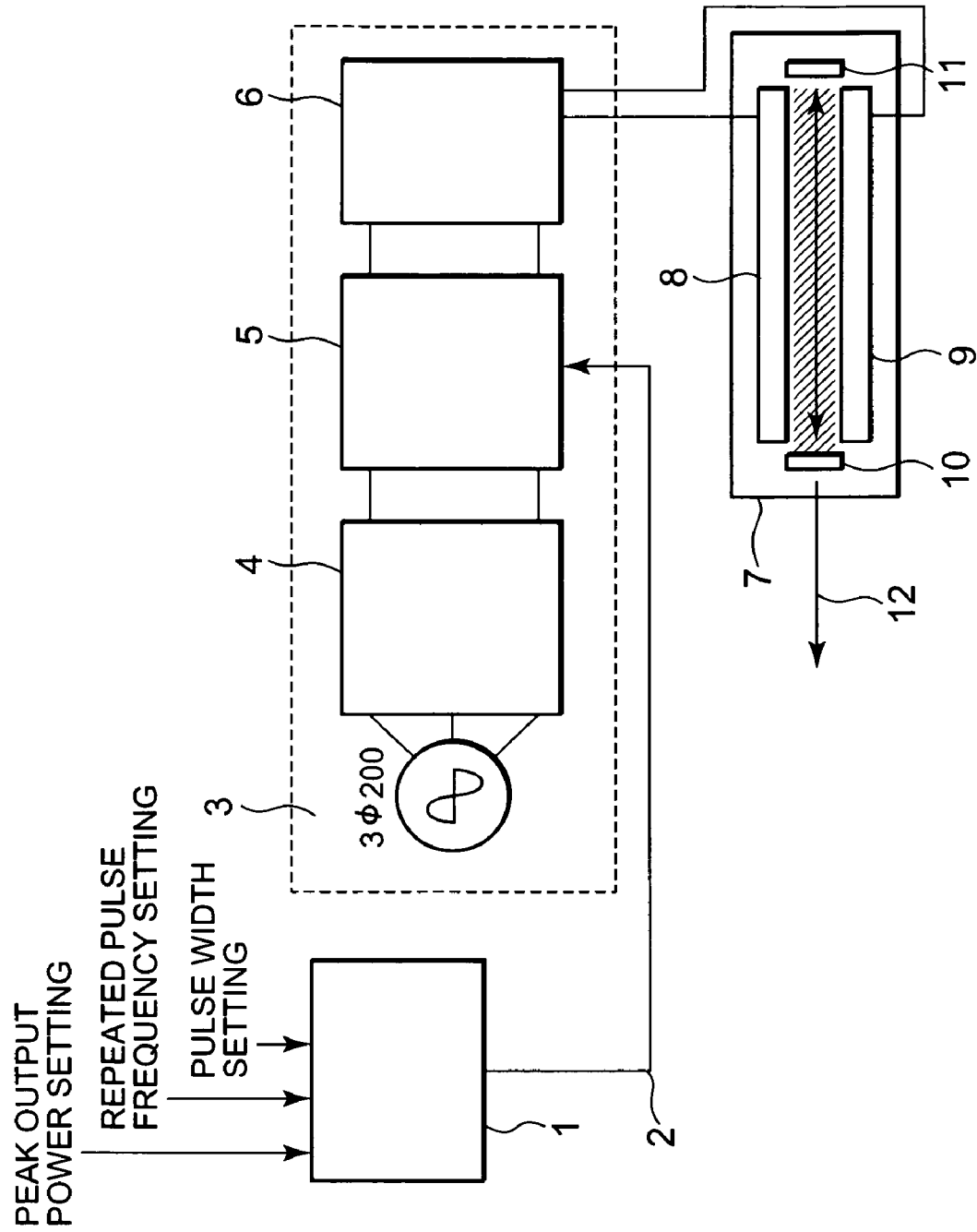
FIG. 9 is a basic configurational view illustrating a conventional pulse laser generator.

Next, an example of setting screens for setting control parameters that control actual laser output power is represented in FIG. 8.

In FIG. 8, because the setting in which the command pulses are thinned-out is varied in response to the pulse width to be set, pulse width mode items for setting the thinning-out number are provided, and, in response to the pulse width to be set, a short mode in which the thinning-out operation is not performed or a long mode in which the thinning-out operation is performed, is set.

The above described mode selection signal is accordingly outputted from the controller to the thinning-out circuit; then selection is carried out whether the thinning-out operation is performed with respect to the command pulse sets.

However, regarding a switching operation between their modes, because the controller 1 may automatically switch based on the pulse width that has been set as described above, it does not always need to be received as a setting item.

In a case of this configuration, because the peak output power of supplied electric power automatically increases or decreases in accordance with whether the thinning-out operations of the command pulse sets outputted from the controller are performed, the peak output power to be set may also be constant; therefore, the peak-output-power setting item does not always need to be provided.

However, when the laser pulse output energy is finely trimmed based on, for example, the discharging voltage increasing or decreasing, the case is not included in this limitation.

According to the present invention, by thinning-out the pulsed electric power ac components, which are supplied from the electric power supplying unit with the command pulse sets being outputted from the controller, by a constant number and at constant intervals, the available pulse width of the laser output power can be considerably expanded without increasing the switching number.

In addition, by bringing both the peak output power and the pulse width of the laser pulse output under simultaneous control, an effect can be obtained, in which control of the pulse laser generator becomes easier than that in the conventional one.

Moreover, by adding a function for switching the thinning-out number of the pulsed electric power ac components, which are supplied from the electric power supplying unit with the command pulse sets being outputted from the controller, an effect is obtained, in which an available range of the pulse laser generator, having the same electric power capacity as the conventional supplying unit, can be made wider than that in the conventional one.

Further more, by providing a unit that can, according to machining conditions, switch between a case in which a pulse width from approximately 1 µs to several dozen µs is used, and a case in which a pulse width is expanded to use, from several dozen µs to several hundred µs without increasing the switching number, by thinning-out the pulsed electric power ac components supplied by a constant number and at constant intervals, the machinable range can be more expanded than that in the conventional one.

INDUSTRIAL APPLICABILITY

As described above, laser machining apparatus and the control method for the apparatus are suited to be used particularly for micro machining.

What is claimed is:
1. Laser machining apparatus comprising:
   a control means for outputting command pulse sets according to control parameter settings for controlling laser pulse output power;
   a thinning-out means, into which the command pulse sets are inputted, for switching a number of pulses thinned out from the command pulse sets, according to a pulse width setting of the control parameters
   an electric power supplying means for generating, in response to command pulse sets outputted from the thinning-out means, pulsed electric power supplied to a load; and
   a generating means for pumping, to output a laser beam, a laser medium with which a discharging space is filled, by means of discharge generated by the pulsed electric power supplied from the electric power supplying means.

2. Laser machining apparatus as recited in claim 1, wherein a switching period of the inverter circuit is set shorter than both the time constant for the rise/fall of the electric discharging power and the time constant for the fall of the laser output power.

3. A control method for laser machining apparatus that outputs a laser beam, the method comprising:
   outputting command pulse sets according to control parameter settings for controlling laser pulse output power,
   generating, in response to the command pulse sets, pulsed electric power supplied to a load,
   pumping a laser medium, with which a discharging space is filled, by means of discharge generated by the pulsed electric power, and
   changing the switching number of an inverter circuit in an electric power supplying means for generating the pulsed electric power, by thinning out the command pulse sets according to a pulse width command of the control parameters.

4. The laser machining apparatus as recited in claim 1, wherein two or more modes are provided according to the pulse width setting, the control means discriminates which of the modes is selected according to the pulse width setting, and outputs a mode select signal, and thereby the thinning out means outputs pulse signals with a thinning-out number of pulses being switched.

* * * * *